United States Patent
Bessonov et al.

(10) Patent No.: US 10,522,706 B2
(45) Date of Patent: Dec. 31, 2019

(54) PHOTOSENSITIVE FIELD-EFFECT TRANSISTOR

(71) Applicant: EMBERION OY, Espoo (FI)

(72) Inventors: Alexander Bessonov, Cambridge (GB); Mark Allen, Cambridge (GB)

(73) Assignee: EMBERION OY, Espoo (FI)

( * ) Notice: Subject to any disclaimer, the term of this patent is extended or adjusted under 35 U.S.C. 154(b) by 0 days.

(21) Appl. No.: 16/183,298

(22) Filed: Nov. 7, 2018

(65) Prior Publication Data
US 2019/0140130 A1    May 9, 2019

(30) Foreign Application Priority Data

Nov. 7, 2017 (GB) .................................. 1718408.6

(51) Int. Cl.
*H01L 31/028* (2006.01)
*H01L 31/112* (2006.01)
*H01L 31/0352* (2006.01)

(52) U.S. Cl.
CPC ........ *H01L 31/1129* (2013.01); *H01L 31/028* (2013.01); *H01L 31/035218* (2013.01)

(58) Field of Classification Search
CPC ............... H01L 27/085; H01L 29/1606; H01L 29/66045; H01L 31/1129; H01L 31/028; H01L 31/035218
See application file for complete search history.

(56) References Cited

U.S. PATENT DOCUMENTS

2013/0032782 A1    2/2013  Gerasimos et al.
2013/0285018 A1    10/2013  Yoo et al.
(Continued)

FOREIGN PATENT DOCUMENTS

CN    103682102 A    3/2014
EP    2975652 A1    1/2016
(Continued)

OTHER PUBLICATIONS

Jan. 21, 2019 Search Report issued in International Patent Application No. PCT/FI2018/050804.
(Continued)

*Primary Examiner* — Cuong Q Nguyen
(74) *Attorney, Agent, or Firm* — Squire Patton Boggs (US) LLP

(57) ABSTRACT

A photosensitive field-effect transistor configured to provide an electrical response when illuminated by electromagnetic radiation incident on the transistor. The photosensitive field-effect transistor comprises a layer of two-dimensional material which forms a horizontal transistor channel configured to transport current, and a horizontal semiconducting layer in contact with the transistor channel. The semiconducting layer comprises two or more assemblies of semiconducting material. If the two-dimensional material in the transistor channel has a high work function, the assemblies of semiconducting material are vertically stacked on the transistor channel in order of decreasing work function. If the two-dimensional material in the transistor channel has a low work function, the assemblies of semiconducting material are vertically stacked on the transistor channel in order of increasing work function. The semiconducting materials may, for example, comprise semiconductor nanocrystals, quantum dots or thin-film semiconducting layers.

13 Claims, 8 Drawing Sheets

(56) References Cited

U.S. PATENT DOCUMENTS

| | | | |
|---|---|---|---|
| 2015/0364545 A1* | 12/2015 | Heo | H01L 31/028 257/24 |
| 2016/0005894 A1* | 1/2016 | Zhang | H01L 31/035218 257/29 |
| 2016/0020280 A1 | 1/2016 | Heo et al. | |
| 2019/0115442 A1* | 4/2019 | Teo | H01L 29/66045 |

FOREIGN PATENT DOCUMENTS

| | | |
|---|---|---|
| EP | 3 147 954 A1 | 3/2017 |
| EP | 3 163 296 A1 | 5/2017 |
| WO | 2011139236 A1 | 11/2011 |

OTHER PUBLICATIONS

F.H.L. Koppens et al., "Photodetectors based on graphene, other two-dimensional materials and hybrid systems", Nature Nanotechnology, vol. 9, 780 (2014); abstract; figures 5-7; sections "Graphene-semiconductor heterojunction photodetectors" and "Hybrid phototransistors", and references therein.

J. Li et al., "Photosensitive Graphene Transistors", Advanced Materials, vol. 26, 5239 (2014); abstract; figures 1,16; sections 1 and 4.4, and references therein.

H. Tian et al., "Novel Field-Effect Schottky Barrier Transistors Based on Graphene-MoS2 Heterojunctions", Scientific Reports, vol. 4, 5951 (2014); abstract; p. 1; figures 1, 3-5.

Z. Zhu et al., "Thin film transistors based on two dimensional graphene and graphene/semiconductor heterojunctions", RSC Advances, vol. 7, 17387 (Mar. 20, 2017); abstract; section 2.

British Search Report corresponding to Application No. GB1718408.6, dated Mar. 28, 2018.

* cited by examiner

PHOTOSENSITIVE FIELD-EFFECT TRANSISTOR

FIELD OF THE DISCLOSURE

This disclosure relates to field-effect transistors prepared on a substrate, and more particularly to photosensitive field-effect transistors which can be used for detecting the intensity of electromagnetic radiation.

BACKGROUND OF THE DISCLOSURE

Field-effect transistors which utilize two-dimensional materials in the transistor channel can be used as versatile detectors of electromagnetic radiation at wavelengths ranging from infrared to ultraviolet. A graphene field-effect transistor (GFET), for example, comprises a semiconducting graphene channel whose conductivity increases when it is illuminated by electromagnetic radiation. This increased conductivity can be measured, and strongly amplified, in a field-effect transistor geometry where the current through the channel is controlled by a gate voltage applied to an electrode adjacent to the channel.

Throughout this disclosure, graphene will be the primary example of a two-dimensional material, and graphene field-effect transistors will be the primary devices. However, examples of other semiconducting two-dimensional materials, which exhibit similar behaviour when illuminated by electromagnetic radiation, will also be given.

It is known that graphene absorbs electromagnetic radiation uniformly in a broad range of wavelengths, but absorption in one graphene layer is limited to a few percentage points of the total radiation intensity at most wavelengths. The optical absorption and spectral responsivity of a graphene field-effect transistor can be increased by preparing an additional photoactive layer adjacent to the graphene channel. Such photoactive layers may be semiconducting.

A built-in electric field (electrostatic potential) may be formed between the photoactive layer and the graphene layer in thermodynamic equilibrium. It may facilitate trapping of minority carriers when electromagnetic radiation illuminates the photoactive material.

Corresponding majority carriers can recirculate in the transistor channel many times before recombining. The photoactive layer may thereby donate charge carriers to the graphene channel when they are released in the photoactive layer by electromagnetic radiation, and change the conductivity of the graphene channel. This carrier multiplication process can greatly improve the sensitivity of a photosensitive field-effect transistor.

Photoactive layers can also expand the spectral response of GFETs to a broader wavelength range. By selecting a semiconductor with a given optical bandgap to the photoactive layer, the photosensitive field-effect transistor can be sensitized to respond particularly strongly to radiation wavelengths which exceed this bandgap.

Document US20150364545 discloses a field-effect transistor with semiconducting layers adjacent to a graphene layer.

A general problem in GFET photodetection assisted by semiconducting photoactive materials is that the magnitude of the multiplicative effect depends on the energetics of the interface between graphene and the photoactive layer. The energetics can be unfavourable if the strength of the built-in electric field is low. This can, for example, be the case when the bandgap of the semiconducting photoactive material corresponds to long infrared wavelengths.

BRIEF DESCRIPTION OF THE DISCLOSURE

An object of the present disclosure is to provide a device for alleviating the above disadvantage. The objects of the disclosure are achieved by an arrangement which is characterized by what is stated in the independent claims. The preferred embodiments of the disclosure are disclosed in the dependent claims.

The disclosure is based on the idea of forming a semiconducting layer comprising ordered assemblies of semiconducting material next to the channel of the photosensitive transistor. The semiconducting materials in these assemblies may differ from each other in terms of their electrical properties. In particular, the work function of each semiconducting material may be different. When the assemblies are arranged in a suitable vertical order, a built-in electric field is formed through the semiconducting layer. The electric field funnels charge carriers of one type efficiently to the transistor channel when the semiconducting layer is illuminated by electromagnetic radiation.

An advantage of the arrangement presented in this disclosure is that the electrical properties of a photoactive layer can be improved while also meeting the desired optical requirements in the same photoactive layer.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1A:
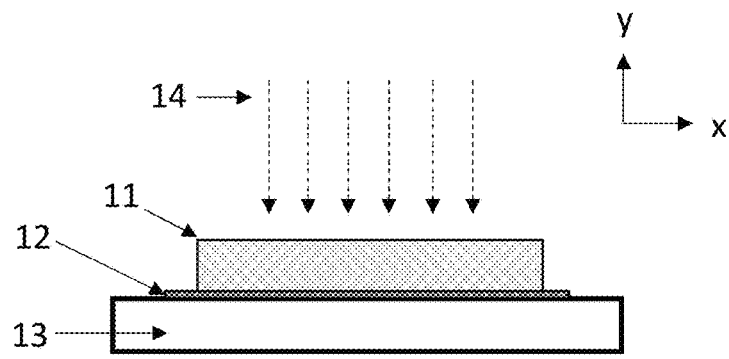
FIGS. 1a and 1b illustrate the relative positioning of the semiconducting layer and the two-dimensional channel layer in a photosensitive field-effect transistor.

This disclosure describes a photosensitive field-effect transistor configured to provide an electrical response when illuminated by electromagnetic radiation incident on the transistor. The photosensitive field-effect transistor comprises at least one electrically conducting source electrode and at least one electrically conducting drain electrode, and a layer of two-dimensional material which forms a horizontal transistor channel configured to transport current between the at least one source electrode and the at least one drain electrode. The photosensitive field-effect transistor also comprises at least one electrically conducting gate electrode which overlies or underlies the layer of two-dimensional material.

The photosensitive field-effect transistor also comprises a horizontal semiconducting layer in contact with the transistor channel, which can be configured to donate charge carriers to the transistor channel when electromagnetic radiation is absorbed in the semiconducting layer, wherein the semiconducting layer comprises two or more assemblies of semiconducting materials.

The two-dimensional material in the transistor channel may have a high work function, and in this case the assemblies of semiconducting material are vertically stacked on the transistor channel in order of decreasing work function. Alternatively, the two-dimensional material in the transistor channel may have a low work function, and in this case the assemblies of semiconducting material are vertically stacked on the transistor channel in order of increasing work function.

In this disclosure, the (electron) work function of a semiconducting material means the energy difference between the Fermi-level of the semiconductor and the vacuum energy level immediately outside of the surface of the semiconducting material. In other words, the work function is a surface property which is determined before the semiconducting material is brought into contact with other materials. After an assembly of semiconducting material has been incorporated in a stack which includes several adjacent assemblies, the difference between the Fermi-level energy in the semiconducting material and the vacuum energy level outside of the surface of the stack may differ from the work function.

In this disclosure, the assemblies of semiconducting material are understood to be vertically stacked on the transistor channel in order of decreasing work function if the work function of the semiconducting material is largest is in contact with the transistor channel, and the work function of the semiconducting material in each additional assembly in the stack is smaller than the work function of the semiconducting material in every assembly which is closer to the channel than said additional assembly.

Conversely, the assemblies of semiconducting material are understood to be vertically stacked on the transistor channel in order of increasing work function if the assembly where the work function of the semiconducting material is smallest is in contact with the transistor channel, and the work function of the semiconducting material in each additional assembly in the stack is larger than the work function of the semiconducting material in every assembly which is closer to the channel than said additional assembly.

The direction of the desired work function gradient in the semiconducting layer depends on the work function of the two-dimensional material in the transistor channel. If the two-dimensional material is a high work function material then it is typically easier to configure the semiconducting layer to donate holes to the transistor channel when it is illuminated, than to configure it to donate electrons under illumination. The built-in electric field should therefore point towards the channel. A built-in electric field in this direction may be generated by stacking the assemblies of semiconducting material in order of decreasing work function. A "high" work function in the two-dimensional material may, for example, correspond to a work function greater than 4 eV. Graphene may be considered a high work function material.

If the two-dimensional material is a low work function material such as tungsten ditelluride, for example, then it is typically easier to configure the semiconducting layer to donate electrons to the transistor channel than to configure it to donate holes. The built-in electric field should therefore point away from the channel. A built-in electric field in this direction may be generated by stacking the assemblies of semiconducting material in order of increasing work function. A "low" work function in the two-dimensional material may correspond for example to a work function smaller than 5 eV.

Two-dimensional channel materials with work functions in the range 4-5 eV may be utilized either as low work function materials or as high work function materials in the manner described in this disclosure. The work function of the two-dimensional channel material also depends to some extent on the doping magnitude, the gating structure in the field-effect transistor and the applied gate voltage, so it is possible to adjust the work function of the channel material to some extent. In other words, the choice of a two-dimensional material is not the only variable which determines if the material in question should be considered a "low work function" or "high work function" channel material.

In this disclosure, the verbs "overlie" and "underlie" refer to vertical alignment without direct contact. When a first layer "overlies" or "underlies" a second layer, the first layer and the second layer are vertically aligned, but they are not in direct contact with each other. In other words, the two layers have both been deposited on a given area of the substrate, but a third intervening layer has been deposited between them. These three layers are all vertically aligned. As discussed below, the photosensitive field-effect transistor may either comprise a top gate which overlies the transistor channel and is separated from the transistor channel by a gate-insulating layer, or it may comprise a bottom gate which underlies the transistor channel and is separated from the transistor channel by the gate-insulating layer.

In addition to direct physical contact, the term "in contact with" can in this disclosure also mean electrical contact without direct physical contact. In other words, when the semiconducting layer, or a portion of the semiconducting layer, is in contact with the transistor channel, the semiconducting layer can be physically separated from the transistor channel by an intermediate layer, but still be in contact with the transistor channel because the intermediate layer is sufficiently thin to allow charge carriers to pass through it. For example, the intermediate layer may be a host material wherein the semiconductor nanocrystals are embedded, or it may be a thin insulating or semiconducting layer on the surface of the transistor channel. If charge carriers can pass through the intermediate layer, for example by tunnelling, then the semiconducting material may still be considered to be "in contact with" the transistor channel.

The transistor channel extends between the source electrode and the drain electrode, and the at least one gate electrode is adjacent to a region of the transistor channel which lies between the source electrode and the drain electrode.

In this disclosure, the term "semiconducting layer" has the same meaning as the term "photoactive layer". The discussion below will prioritize the term "semiconducting layer" to emphasize that all elements in this layer are semiconducting.

Figure 1B:
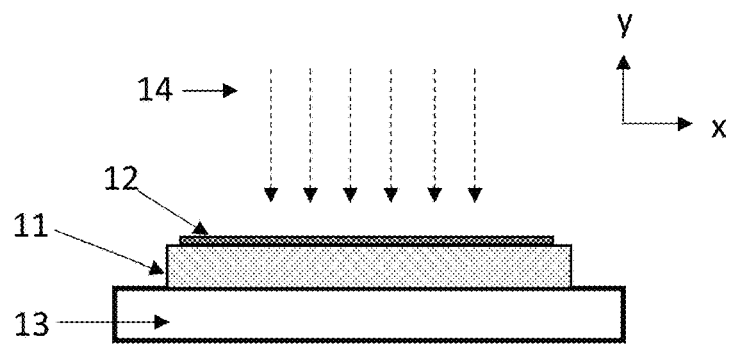

FIGS. 1a and 1b illustrate schematically the relative positioning of the semiconducting layer 11 and the two-dimensional channel layer 12 in a photosensitive field-effect transistor. In this disclosure, the term "horizontal" refers to the x-direction in FIGS. 1a and 1b, while the term "vertical" refers to the y-direction. The transistor channel 12 is horizontal in FIGS. 1a and 1b because the layers lie on a horizontal substrate surface.

In this disclosure, terms such as "horizontal transistor channel" or "horizontal semiconductor layer" do not mean that the entire channel/layer lies precisely in the same horizontal plane. The channel/layer may be deposited over other layers which comprise small vertical steps. The term "horizontal" merely indicates that the primary orientation of the thin channel/layer is determined by the substrate plane. Furthermore, terms such as "vertical" and "horizontal" do not imply anything about the orientation of the substrate when the device is manufactured, or when the device is in use. The device and the substrate may be oriented in any suitable direction during usage and manufacturing, for example sideways in such a manner that a layer which is in this disclosure referred to as "horizontal", is vertical. In other words, the terms "horizontal" and "vertical" merely define two orthogonal directions, one of which is parallel to the substrate surface, and the other of which is normal to this surface.

In FIG. 1a, taking graphene as an example of a two-dimensional material, the graphene layer 12 has been deposited on the substrate 13, and the semiconducting layer 11 has then been deposited on the graphene layer 12. In FIG. 1b the deposition order is the reverse, so that semiconducting layer 11 has been deposited on the substrate 13 and graphene layer 12 has been deposited on the semiconducting layer 11. Either ordering can be utilized in a graphene field-effect transistor.

Both of these layers 11 and 12 are illustrated lying directly on a substrate 13. However, other layers, such as a gate electrode and/or an insulating layer, may also be interposed between the graphene layer 12 and the substrate 13 in FIG. 1a, or between the semiconducting layer 11 and the substrate 13 in FIG. 1b. The other components of the photosensitive field-effect transistor are not illustrated in FIGS. 1a and 1b. The Figures in this disclosure have not been drawn to scale.

In both FIGS. 1a and 1b, the graphene layer 12 may constitute a transistor channel extending between a source electrode and a drain electrode, even though a complete transistor is not illustrated. When electromagnetic radiation 14 impinges on the photosensitive field-effect transistor, photons are absorbed in both the graphene layer 12 and the semiconducting layer 11. The semiconducting layer 11 can absorb more radiation than the graphene layer 12, and the majority charge carriers released in the semiconducting layer 11 in this absorption event may change the conductivity of the graphene layer 12, as explained above.

The mere proximity of semiconducting layer 11 to graphene layer 12 is sufficient to allow some majority charge carriers from the semiconducting layer 11 to enter the graphene layer 12 and change its conductivity before they recombine with corresponding minority carriers. However, this effect will be much more pronounced in the presence of an internal electric field which continuously drives majority and minority carriers in opposite directions. Recombination becomes much less likely when the electric field traps minority carriers in the semiconducting layer and funnels majority carriers into the graphene layer. The minority carriers can be trapped either in the conduction/valence band, or in the sub-gap energy states.

Figure 1C:
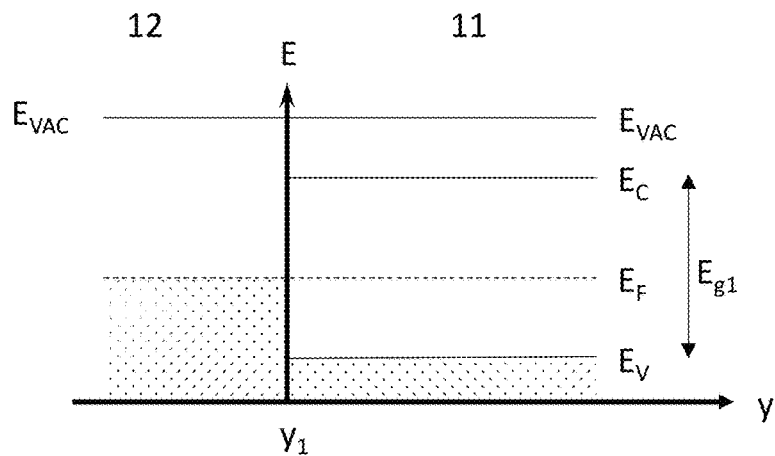
FIG. 1c illustrates an energy band diagram at the interface between a channel layer and a semiconducting layer comprising only one semiconducting material.

A built-in electric field is formed at the interface between semiconducting layer 11 and graphene layer 12 when there is electrical asymmetry in the semiconducting layer 11. A single layer of graphene is a zero-gap semiconductor, which can be also referred to as a zero-overlap semimetal. FIG. 1c illustrates an energy band diagram at the interface between a graphene layer 12 and a semiconducting layer 11 which comprises semiconductor nanocrystals. The horizontal axis in FIG. 1c shows a spatial coordinate y. This axis is parallel with the vertical direction in FIGS. 1 a and 1 b. In other words, the y-axis is perpendicular to the horizontal interface between semiconducting layer 11 and graphene layer 12. This interface lies at the coordinate yi and the semiconducting material 11 corresponds to positive values of y in FIG. 1c. In other words, since FIG. 1a illustrate layers stacked in a different order than FIG. 1b, in FIG. 1a the positive y-direction is upwards, and in FIG. 1b the positive y-direction is downward. The vertical axis in FIG. 1c shows the electron energy.

Energy band diagrams resembling the one depicted in FIG. 1c may, for example, be obtained when the semiconducting layer 11 comprises PbS nanocrystals with a work function of 4.7 eV and a bandgap of 0.7 eV. The work function of semiconductor nanocrystals may to some extent be modified by changing the doping state of the nanocrystals, but this technical effect is often difficult to achieve in narrow bandgap nanocrystals without either compromising their stability or inadvertently shifting the valence and conduction bands as well. Surface ligands can also shift the Fermi level and band edge energies of nanocrystals. However, this effect is progressively reduced with decreasing the bandgap, owing to surface-to-volume ratio reduction.

Therefore, when the Fermi level $E_F$ has thermodynamically equalized on the two sides of an interface between graphene and the narrow bandgap semiconductor nanocrystal in FIG. 1c, the conduction band $E_C$ and the valence band $E_V$ may remain at the same energy level throughout the semiconducting material 11. In other words, the energy levels of the conduction and valence bands do not vary as a function of y, so there is no band bending in the semiconductive material 11. Consequently, there is no built-in electric field which would assist the transportation of charge carriers toward the graphene layer 12 before they recombine.

In other words, some materials which absorb radiation at long infrared wavelengths (for example semiconductor nanocrystals with bandgaps below 0.8 eV) may be relatively passive from an electrical perspective when interfaced on their own with a graphene layer. Such materials absorb incoming infrared photons, but exciton dissociation and charge separation will not be very effective. A significant amount of recombination may occur, and the charge multiplication which occurs in the channel will not be optimal.

In other words, if a photoactive semiconducting layer comprises just one material, the carrier multiplication process induced by a low bandgap material, which can absorb long infrared wavelengths, is typically not as effective as the multiplication process induced by a large bandgap material, which absorbs only shorter wavelengths. It is more difficult to increase measurement efficiency at infrared wavelengths than at shorter wavelengths.

The bandgap of a semiconductor nanocrystal depends on the physical size of the nanocrystals (diameter in the case of spherical particles). Decreasing the size of particles to less than their Bohr radius results in confinement of electron and hole wavefunctions and a significant increase in bandgap. At the nanoscale (2 to 20 nm), larger semiconductor nanocrystals typically have a smaller bandgap than smaller semiconductor nanocrystals. Also, large-size semiconductor nanocrystals tend to have relatively deeper conduction band edge energy levels and larger work functions. The physical size and shape of semiconductor nanocrystal particles is adjustable through colloidal synthesis conditions such as the reaction time, temperature, concentration, and other synthetic parameters. However, the work function of semiconductor nanocrystals may often be changed without altering the size of the nanocrystals. The work function of a semiconductor nanocrystal is adjustable through either stoichiometric self-doping or extrinsic doping by foreign elements. Stoichiometric imbalance may arise unintentionally during nanocrystal synthesis, or it may be introduced intentionally during or after synthesis. The doping level of semiconductor nanocrystals can also be tuned by anion or cation exchange or other redox reactions. For example, anion exchange in PbS nanocrystals thought halogen redox reactions leads to increased n-type doping.

The electrical properties of colloidal semiconductor nanocrystals also depend to a large extent on their capping ligands, which provide electrical coupling of adjacent nanoparticles and can exhibit a surface dipole moment on the nanocrystal. The ligands may influence the energetics of semiconductor nanocrystals, including their valence and conduction band levels and the Fermi-level, so that they differ significantly from the properties of the corresponding semiconductor bulk material. In other words, when an assembly of semiconducting material comprises nanocrystals, the electrical properties of this assembly are determined both by the material of the nanocrystals themselves and by the capping ligands on the surface of the nanocrystals. Ligand chemistry can be used to adjust the work function of an assembly of semiconductor nanocrystals.

Figure 1D:
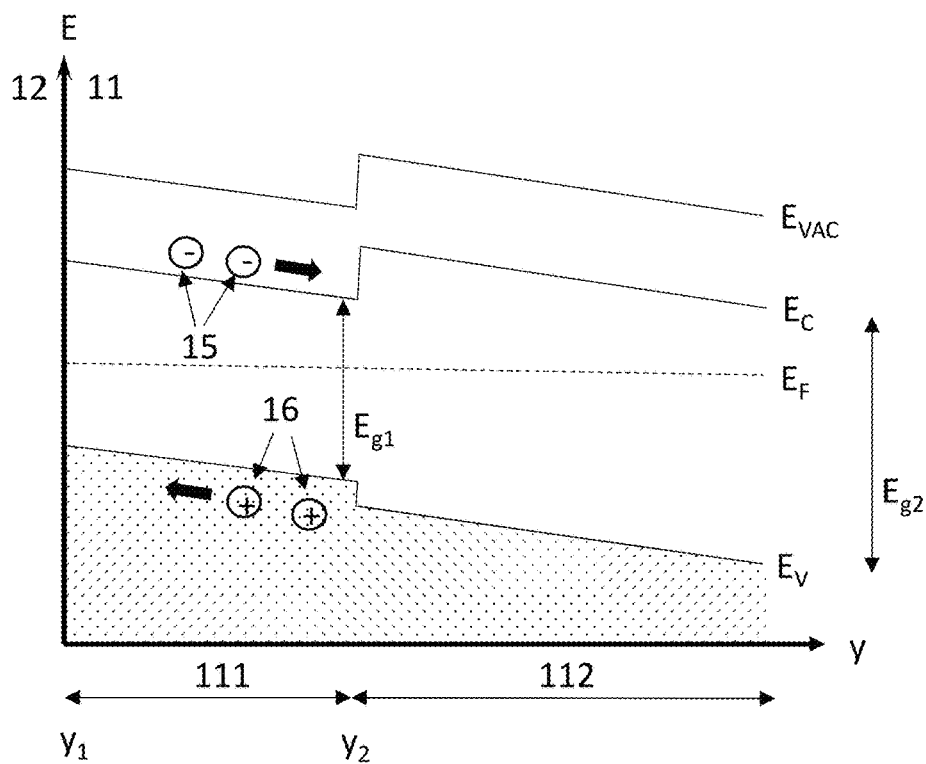
FIGS. 1d-1f illustrate energy band diagrams at the interface between a channel layer and a semiconducting layer comprising a tandem stack of semiconducting materials.

FIG. 1d illustrates the energy band diagram at the graphene/semiconductor interface in an exemplary photosensitive field-effect transistor which comprises a tandem stack in the semiconducting layer. A first assembly of semiconducting material 111 is sandwiched between a graphene layer 12 with a high work function and a second assembly of semiconducting material 112. The assembly 111 and the assembly 112 are joined at the interface at y-coordinate $y_2$. If the work function of the second semiconducting material in the second assembly 112 is smaller than the work function of the semiconducting material in the first assembly of semiconducting material 111, the valence and conduction band energy levels will shift downward in both assemblies 111 and 112, as illustrated in FIG. 1d. The conductivity of the graphene layer 12 is modulated by holes 16 donated from semiconducting layer 11.

The number of assemblies in the semiconducting layer be more than two. The first assembly 111 is in contact with the transistor channel, and the semiconducting material in the first assembly has a higher work function than the semiconducting materials in the additional assemblies (112 and possible further assemblies). The additional assemblies of semiconducting materials are then placed on the stack in order of decreasing work function, so that the work function in an assembly which is further from the 11/12 interface is smaller than the work function in an assembly which is closer to the 11/12 interface.

When the assemblies are vertically stacked on the transistor channel 12 in order of decreasing work function, the band bending in the semiconducting layer creates a built-in electric field which transports holes towards the graphene channel. Even a small difference in work function, for example 0.1 eV, between semiconducting materials in any adjacent assemblies is sufficient to generate a built-in electric field. However, larger differences may be preferable if the number of assemblies is two or three.

As illustrated in FIG. 1d, the bandgap of the semiconducting material in the first assembly 111 may be smaller than the bandgap of the semiconducting materials in the seond assembly 112. In some cases, in addition to being stacked in a vertical order in order of decreasing or increasing work function, the assemblies of semiconducting material may simultaneously be stacked in order of increasing bandgap. In other words, the assembly where the semiconducting material has the largest work function may also be the assembly where the semiconducting material has the smallest bandgap, and vice versa.

Figure 1E:
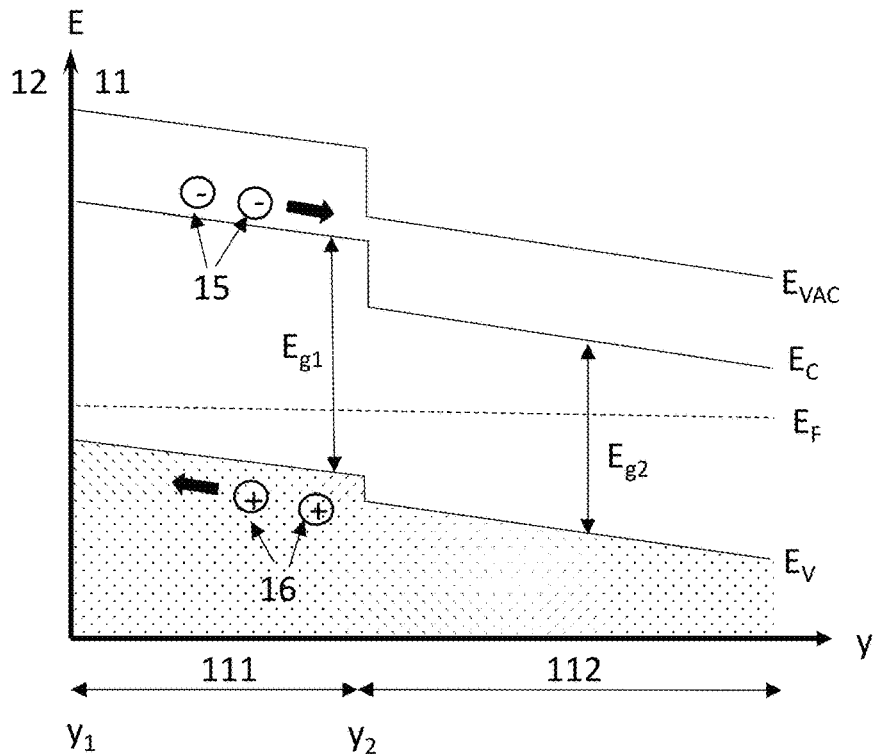

However, simultaneous ordering according to bandgap is not always necessary and may not always be possible. A built-in electric field can nevertheless be generated in the semiconducting layer even if the bandgaps are in the reverse order, decreasing with distance from the 11/12 interface, or in any random order. FIG. 1e illustrates schematically a situation where the bandgap of the semiconducting material in the first assembly 111 is larger than the bandgap of the semiconducting material in the second assembly 112. It can be seen that the required work function difference (for producing the built-in electric field) is larger when the bandgaps are ordered in this way, but the same effect can nevertheless be obtained.

Figure 1F:
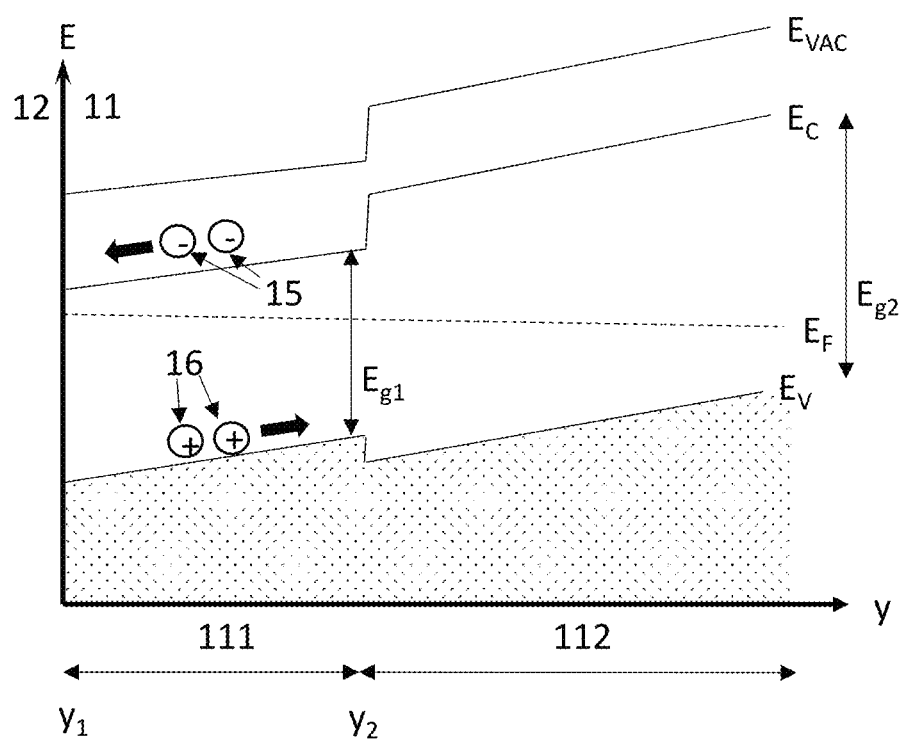

FIG. 1f illustrates schematically an alternative configuration where the work function of the channel material 12 is relatively low, and the work function of the second semiconducting material in the second assembly 112 is greater than the work function of the semiconducting material in the first assembly of semiconducting material 111. The valence and conduction band energy levels then shift upward in both assemblies 111 and 112, as illustrated in FIG. 1f. The conductivity of the two-dimensional channel layer 12 is modulated by electrons 15 donated from semiconducting layer 11.

As mentioned before, the number of layers may optionally be increased, so that one or more additional assemblies (not illustrated) which comprises a third semiconducting material is prepared within semiconducting layer 11, for example to the right of second assembly 112 in FIGS. 1d-1f. If one additional assembly of semiconducting material is added to the structures in FIGS. 1d and 1e, the semiconducting material in this additional assembly should have a smaller work function than the semiconducting material in the second assembly 112. If one additional assembly of semiconducting material is added to the structure in FIG. 1f, the semiconducting material in this additional assembly should have a greater work function than the semiconducting material in the second assembly 112.

Further assemblies of semiconducting material can be added to the stack in semiconducting layer 11 as needed. As long as the assemblies of semiconducting material are vertically stacked on the transistor channel either in order of decreasing work function (FIG. 1d) or in order of increasing work function (FIG. 1f), the electric field will extend through the first assembly 111, the additional assembly 112, and all additional assemblies prepared to the right of 112, without barriers for hole transport in the valence band or for electron transport in the conduction band, respectively.

The direction of band bending (upward or downward as a function of y in the energy band diagram) depends on the work functions of the semiconducting materials in the stacked assemblies, but also on the properties of the two-dimensional material which forms the transistor channel. Furthermore, the direction and degree of band bending may also be tuned by modulating the Fermi-level in the transistor channel layer with field effect gating through one or more gate electrodes. Certain two-dimensional materials, such as graphene, can be paired either with a semiconducting layer where the assemblies are stacked in order of decreasing work function, or with a semiconducting layer where the assemblies are stacked in order of increasing work function. The compatibility of graphene with each option depends on the gating employed in the field-effect transistor, and/or on the electrical doping magnitude and polarity of the graphene layer.

The semiconducting layer may be deposited and patternable by standard methods. The standard methods include, but are not limited to, vapour phase deposition, solution based deposition, and standard photolithography methods.

First Semiconducting Layer Embodiment

Figure 2:
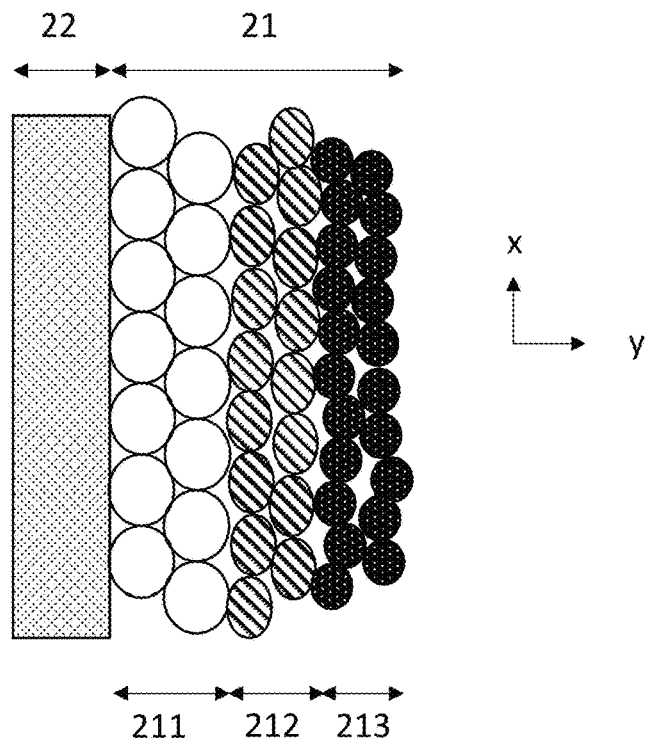
FIGS. 2-3 illustrate the interface between a channel layer and a semiconducting layer according to a first semiconducting layer embodiment.

FIG. 2 illustrates the interface between the channel layer and the semiconducting layer in a first embodiment. Reference numbers 21 and 22 correspond to 11 and 12, respectively, in FIGS. 1a-1f. In FIG. 2, the semiconducting layer 21 comprises a first assembly 211 of a first semiconducting material and two additional assemblies 212 and 213 of additional semiconducting materials. These additional assemblies may be called the second and third assemblies, respectively.

The entire first assembly is sandwiched between the graphene layer 22 and additional assembly 212.

Each of the assemblies of semiconducting material may comprise semiconductor nanocrystals or colloidal quantum dots. The work function of the semiconductor nanocrystals in the second assembly 212 may be smaller than the work function of the semiconductor nanocrystals in the first assembly 211, and larger than the work function of the semiconductor nanocrystals in the third assembly 213. In other words, the assemblies of semiconducting materials may be stacked in order of decreasing work function. Alternatively, the assemblies of semiconducting materials may be stacked in the opposite order, in order of increasing work function.

Optionally, whether the stacking order is by decreasing or increasing work function, the bandgap of the semiconductor nanocrystals in the second assembly 212 may be larger than the bandgap of the semiconductor nanocrystals in the first assembly 211, and smaller than the bandgap of the semiconductor nanocrystals in the third assembly 213.

The semiconducting layer 21 may comprise a first sublayer 211 which comprises a first semiconducting material. The first sublayer may be deposited on the surface of a graphene layer 22. The semiconducting layer 21 may further comprise a second sublayer 212 which comprises a second semiconducting material. This second sublayer 212 may be deposited on the first sublayer 211. The semiconducting layer 21 may further comprise a third sublayer 213 which comprises a third semiconducting material. This third sublayer 213 may be deposited on the second sublayer 212. The semiconducting layer 21 may comprise further sublayers with further semiconducting materials. The sublayers may be deposited in an order where the work function of the semiconducting material in the first sublayer 211 is largest, and the work function of each additional deposited sublayer is smaller than the work function of the sublayer beneath it.

In other words, each of the two or more assemblies of semiconducting material is in this case a unitary layer. The illustrated stack of unitary sublayers 211, 212 and 213 may extend across the entire horizontal area of the interface between the semiconducting layer 21 and the transistor channel 22. Alternatively, the stack of unitary sublayers may cover only a first part of the horizontal area of the interface between the semiconducting layer 21 and the transistor channel 22, and the semiconducting layer may comprise assemblies of semiconducting materials which are stacked in another order, or which are disordered, in a second part of the horizontal area of the interface between the semiconducting layer 21 and the transistor channel 22.

Figure 3:
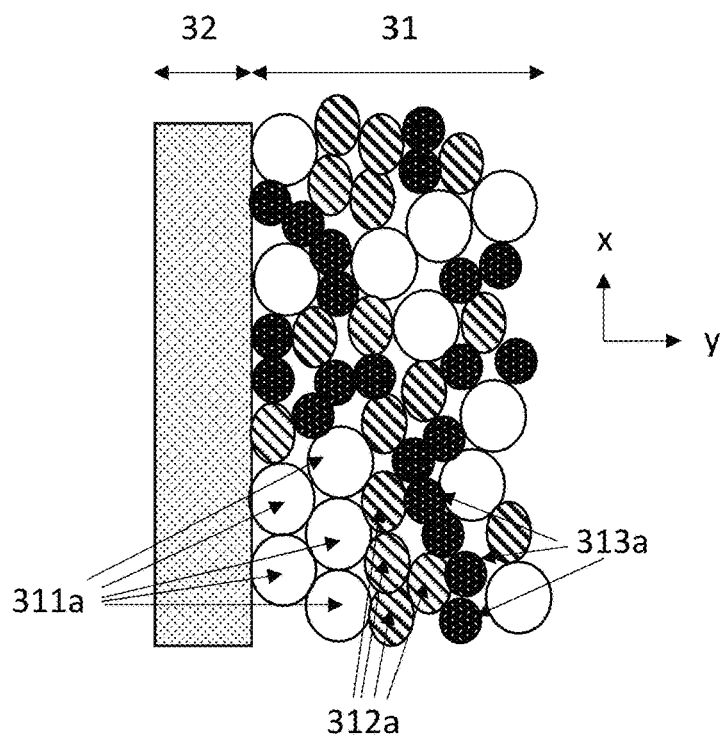

FIG. 3 illustrates a configuration where semiconducting layer 31 comprises an intermixed blend of semiconductor nanocrystals with different optical and electrical properties, next to transistor channel 32. Reference numbers 31 and 32 correspond to 11 and 12, respectively, in FIGS. 1a-1d. In this case, the first assembly 311a is a unitary sublayer which covers only a part of the 31/32 interface, and the second assembly 312a and third assembly 313a may be unitary sublayers adjacent to the first assembly. Other parts of the semiconducting layer are more or less disordered. However, the built-in electric field will in this case be generated only in the area where the first assembly 311a is present, and the magnitude of the charge multiplication effect will be proportional only to this area.

In any of the first, second and third semiconducting layer embodiments, the same material may be used to manufacture semiconductor nanocrystal particles of different size. Therefore, even though the electrical properties of the different assemblies of semiconducting material may differ from each other, the semiconducting material of the semiconductor nanocrystal particles may still be the same in each assembly. The material may also be different in each assembly.

Any of the assemblies of semiconducting material may comprise semiconductor nanocrystals or colloidal quantum dots selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, ClS, InAs, InSb, Ge, Si, graphene, or core/shell nanocrystals with any of the preceding core/shell constituents.

Alternatively, any of the assemblies of semiconducting material may comprise any of the preceding semiconductor nanocrystals or colloidal quantum dots embedded in a host material comprising metal chalcogenide, metal halide, or hybrid halide perovskite. The metal chalcogenide may have the general formula $ME_n$, where E is S, Se or Te, and it may for example be $AsS_x$, CdS, CdSe, CdTe, $CuInS_2$, $SnS_x$, $In_2Se$ or $Bi_2Te_3$. The metal halide may have the general formula $MX_n$, where M is Pb, Bi, Cd, In, Zn, Sn, Cu, Fe, Ga, Li or Sb and X is I, Br or Cl, and it may for example be $PbI_2$ or $BiI_3$. The hybrid halide perovskite may have the general formula $ABX_3$, where A is Cs, $CH_3NH_3$ or $NH_2CH=NH_2$, B is Pb or Sn, and X is Cl, Br or I.

The quantum dot loading in the host material may vary between 1% and 90%. The diameter of the semiconductor nanocrystals or quantum dots may be in the range 2-20 nm.

The capping ligands on the above semiconductor materials may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogenides (S, Se). Inorganic ligands may also include metal halides or metal chalcogenides.

The transistor channel 22 may comprise a layer of graphene, as described above. The transistor channel 22 may also comprise one or more of a graphene-like material, a transition metal dichalcogenide, or another two-dimensional material. The graphene-like material may include phosphorene, silicene, germanene, stanene, GaN, InN, InP, InAs, BAs, BP, or GaP. The transition metal dichalcogenide may include $WE_2$, $MoE_2$, $ScE_2$, $TiE_2$, $HfE_2$, $ZrE_2$, $VE_2$, $CrE_2$, $MnE_2$, $FeE_2$, $CoE_2$, $NiE_2$, $NbE_2$, $TcE_2$, $ReE_2$, $PdE_2$, or $PtE_2$, where E is S, Se or Te.

The same semiconductor nanocrystal or colloidal quantum dot materials, the same host materials and the same ligand materials may also be used in the third semiconducting layer embodiment discussed below.

In any of the first, second and third semiconducting layer embodiments, the stacking order illustrated in FIG. 2 can be implemented in the configuration illustrated in FIG. 1a and in the configuration illustrated in FIG. 1b. In other words, the y-axis indicated in FIG. 2 can point upward in FIG. 1a or downward in FIG. 1b.

In any of the first, second and third semiconducting layer embodiments, the number of layered assemblies 211, 212, 213 . . . of semiconducting material may be larger than three. For example, if the semiconducting layer 21 is prepared in a method where a mixture of semiconductor nanocrystals of different sizes is centrifuged during the deposition process, they may be deposited on the transistor channel 12 in a controlled order. The largest and heaviest semiconductor nanocrystals may adhere to the transistor channel first, the lightest and smallest last. If the initial mixture contains semiconductor nanocrystals of many different sizes, and if the work function has been engineered to vary as a function of size, this method can produce a semiconducting layer 21 where the work function (and possibly also the bandgap) exhibit an almost continuous gradient in the y-direction. Each assembly of semiconducting material may form a monolayer, and the semiconducting layer 21 may comprise an ordered stack of monolayers, with different electrical (and possibly optical) properties in each monolayer.

For reasons of clarity, the graphene layer 22, the first assembly of semiconducting material 211, and the additional assemblies 212 and 213 of semiconducting material have all been drawn approximately equally thick in the y-direction in FIG. 2. However, in practice the graphene layer 22 will be much thinner than the semiconducting layer 21, and possibly also thinner than any sublayer 211, 212 or 213. Furthermore, the thickness of the different assemblies 211, 212 and 213 may be optimized depending on the bandgaps of the semiconducting materials and the wavelength range which is to be detected. If long infrared wavelengths are the primary range of interest, and if assembly 211 comprises the semiconducting material with the smallest bandgap, then this assembly may constitute 50%-90% of the thickness of the semiconducting layer 21. The same considerations concerning layer thicknesses apply to the second and third semiconducting layer embodiments as well.

The work function of the semiconducting material in the first assembly may, for example, be 4-6 eV. Its bandgap may be 0.1-1.0 eV. The work functions of semiconducting materials in the second, third or any subsequent assemblies may, for example, be 3-5 eV. Their bandgap may be 0.8-3.0 eV. These same considerations concerning work function ranges and bandgap ranges and apply to the second and third semiconducting layer embodiments as well.

Second Semiconducting Layer Embodiment

Figure 4:
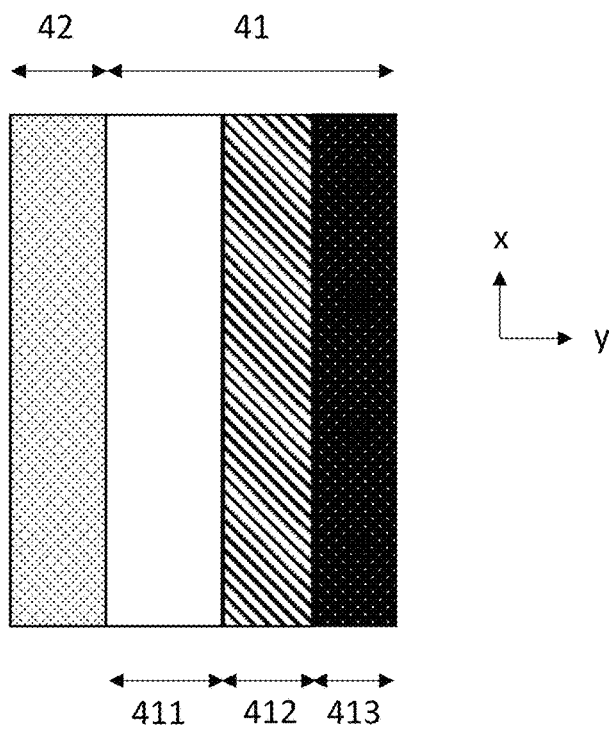
FIG. 4 illustrates the interface between a channel layer and a semiconducting layer according to a second semiconducting layer embodiment.

FIG. 4 illustrates the interface between the graphene layer and the semiconducting layer in a second embodiment. Reference numbers 41 and 42 correspond to 11 and 12, respectively, in FIGS. 1a-1e. In FIG. 4, the semiconducting layer 41 comprises a first assembly 411 of a first semiconducting material and two additional assemblies 412 and 413 of additional semiconducting materials. These additional assemblies may be called the second and third assemblies, respectively. The number of additional assemblies may also be greater than two.

In this embodiment, the assemblies of semiconducting material 411, 412, 413, . . . may be prepared on the transistor channel 42 as thin-film semiconducting layers. In other words, each of the assemblies of semiconducting material may comprise a thin-film semiconducting layer. This thin-film material is not composed of nanoparticles, but may have either crystalline or amorphous structure. Such thin-films may, for example, be sequentially deposited on the transistor channel 42 in a chemical vapour deposition (CVD) or atomic layer deposition (ALD) process and doped with standard processes. The thin-film semiconducting layers may comprise a material selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, CIS, InAs, InSb, Ge, or Si.

Any of these thin-film semiconducting materials may also be used in the third semiconducting layer embodiment presented below.

Third Semiconducting Layer Embodiment

Figure 5:
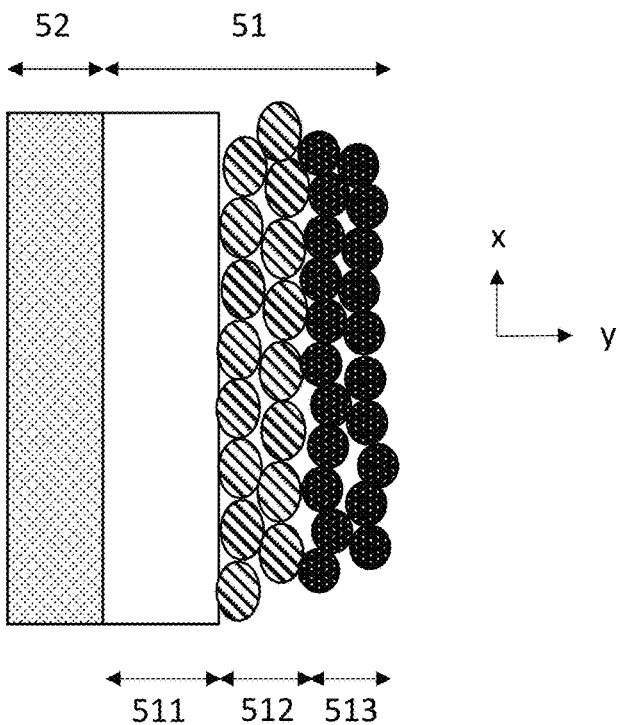
FIG. 5 illustrates the interface between a channel layer and a semiconducting layer according to a third semiconducting layer embodiment.

FIG. 5 illustrates the interface between the graphene layer and the semiconducting layer in a third embodiment. Reference numbers 51 and 52 correspond to 11 and 12, respectively, in FIGS. 1a-1e. In FIG. 5, the semiconducting layer 51 comprises a first assembly 511 of a first semiconducting material and two additional assemblies 512 and 513 of additional semiconducting materials. These additional assemblies may be called the second and third assemblies, respectively. As before, the number of additional assemblies may also be greater than two.

The assembly of semiconducting material which is in contact with the transistor channel comprises a thin-film semiconducting layer, and the additional assemblies of semiconducting material comprise semiconductor nanocrystals or colloidal quantum dots.

In this embodiment, the first assembly of semiconducting material 511 may be prepared on the transistor channel 52 as a thin-film semiconducting layer. The materials used for preparing the first assembly 511 may comprise any of the thin-film semiconducting layers materials specified in the second semiconducting layer embodiment above. The semiconducting thin-film layer may, for example, be deposited on the transistor channel 52 in a CVD or ALD process and doped with standard processes.

The additional assemblies of semiconducting materials 512 and 513 may comprise semiconductor nanocrystals formed of any of the semiconductor nanocrystal materials specified in the first semiconducting layer embodiment above.

First Transistor Device Embodiment

Figure 6A:
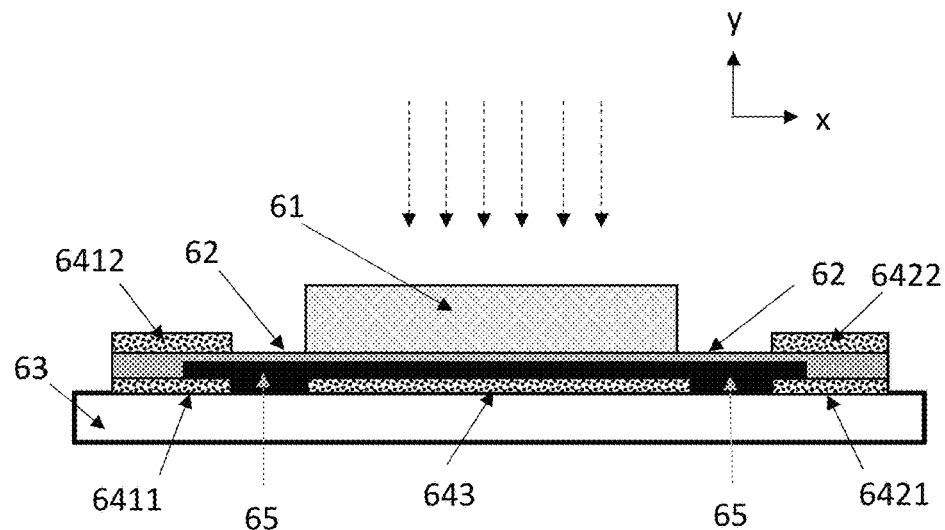
FIGS. 6a-6c illustrate transistor devices according to a first device embodiment.
Figure 6B:
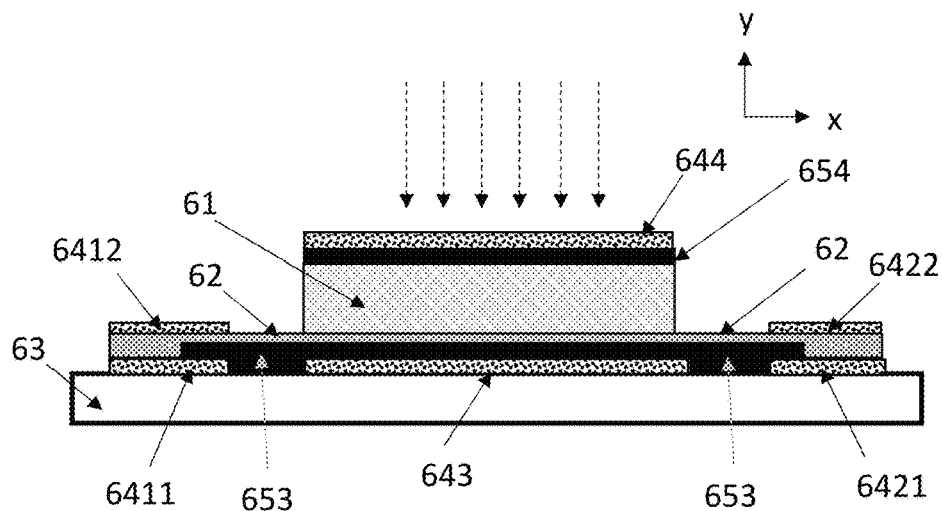
Figure 6C:
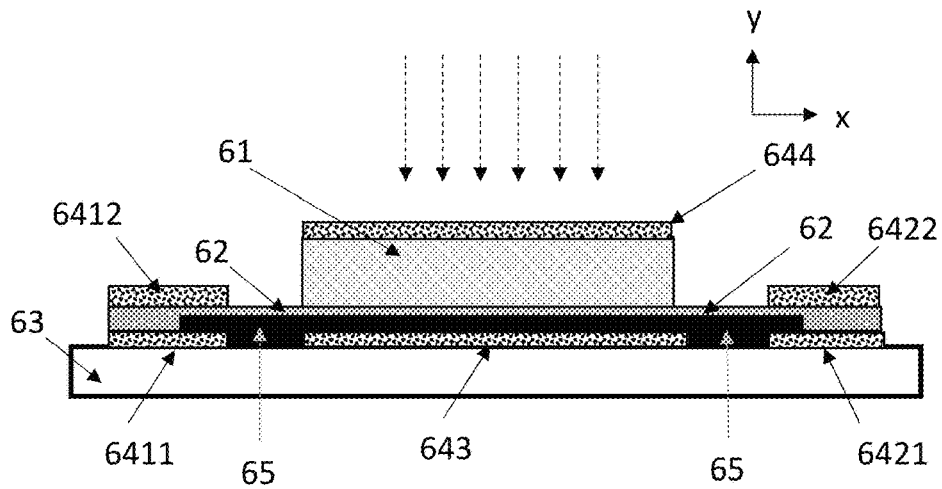

FIGS. 6a-6c illustrate photosensitive field-effect transistors according to a first device embodiment. The layers of the device have not been drawn to scale. In the devices illustrated in FIGS. 6a-6c, the graphene layer 62 and the semiconducting layer 61 have been deposited in the order illustrated in FIG. 1a, with the semiconducting layer 61 on top of the graphene layer 62.

FIG. 6a illustrates a transistor where the semiconducting layer 61 at least partly covers the layer of two-dimensional material 62, the layer of two-dimensional material 62 covers a first insulating layer 65, and the first insulating layer 65 covers a first gate electrode 643.

In this disclosure, the verb "cover" refers to vertical alignment with direct contact. When a first layer "covers" a second layer, the first layer and the second layer are vertically aligned, and they are in direct contact with each other. In other words, the two layers have been sequentially deposited on a given area of the substrate. They are vertically aligned because the second layer has been deposited on this area first, and then the first layer has been deposited on the same area. Within this area, the second layer therefore lies below the first layer in the vertical direction. The first layer "covers" the second layer in this area because no other layers lie between the first and the second layer.

The verb "cover", when used with no further qualifiers, refers to complete vertical alignment where no area of the second layer is uncovered by the first layer. Closed qualified expressions such as "partly cover" are used to refer to partial vertical alignment, where there is an area of the second layer which is not covered by the first layer. Open qualified expressions such as "at least partly cover" are used to refer to vertical alignment which can be either complete or partial.

The photosensitive field-effect transistor comprises, on the surface of the substrate 63, a first source electrode 6411, which is at least partly covered by the graphene layer 62, and a first drain electrode 6421 which is also at least partly covered by the graphene layer 62. The transistor also comprises a second source electrode 6412, which partly covers the graphene layer and at least partly overlies the first source electrode 6411, and a second drain electrode 6422, which partly covers the graphene layer and at least partly overlies the first drain electrode 6421. In all of the transistor devices presented in this disclosure, electrical contact to the graphene layer can be made either with a bottom electrode, such as 6411 and 6421, or with a top electrode, such as 6412 and 6422, ow with both a bottom electrode and a top electrode.

The gate electrode of the field-effect transistor may comprise the first electrode 643 on the surface of the substrate, and an insulating layer 65 may in that case be deposited on the gate electrode to separate it from the graphene layer 62 which forms the transistor channel. The same insulating layer 65 may insulate the electrodes on the surface of the substrate from each other, as illustrated in FIG. 6a.

The graphene layer 62 forms the transistor channel which is in contact with the source electrode(s) 6411/6412 and with the drain electrode(s) 6421/6422. The graphene layer may be deposited on insulating layer 65, as illustrated in FIG. 6a. The semiconducting layer 61 (including all assemblies and sublayers which may be included in the semiconducting layer) may then be deposited on the graphene layer 62.

An alternative configuration is illustrated in FIG. 6b. In this configuration, a second gate electrode 644 at least partly covers a second insulating layer 654. The second insulating layer at least partly covers the semiconducting layer 61, and the semiconducting layer 61 at least partly covers the layer of two-dimensional material 62. This device also comprises a first gate electrode 643 on the surface of the substrate, separated from the layer of two-dimensional material 62 by first insulating layer 653. The configuration illustrated in FIG. 6a may be called a bottom-gate configuration, and the configuration illustrated in FIG. 6b may be called a top-and-bottom-gate configuration.

A third alternative, utilizing a bottom gate 643 and a top electrode 644, is illustrated in FIG. 6c. In this configuration, the semiconducting layer 61 at least partly covers the layer of two-dimensional material 62, the layer of two-dimensional material 62 covers an insulating layer 65, and the insulating layer covers a first gate electrode 643. Additionally, the top electrode 644 at least partly covers the semiconducting layer. In this configuration, and also in the configuration illustrated in FIG. 6b, the first and second gate electrodes 643 and 644 may be used to form an external electric field over the semiconducting layer 61 and the graphene layer 62, which may further improve charge separation at the interface between these two layers.

Second Transistor Device Embodiment

Figure 7A:
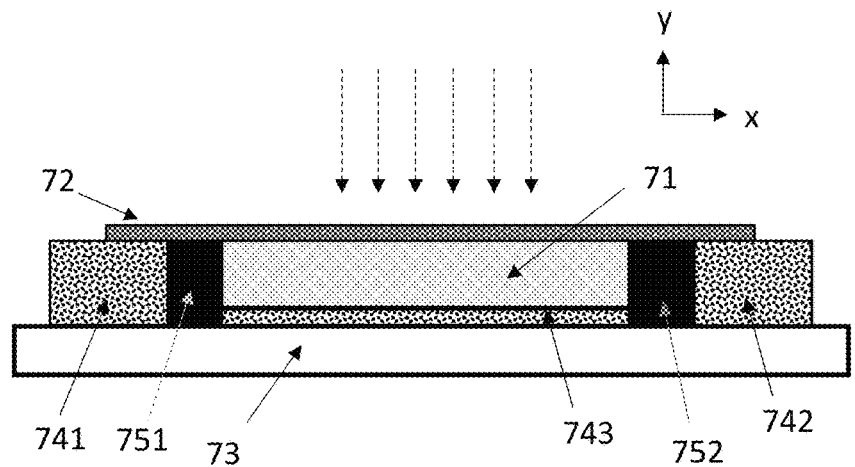
FIGS. 7a-7c illustrate transistor devices according to a second device embodiment.
Figure 7B:
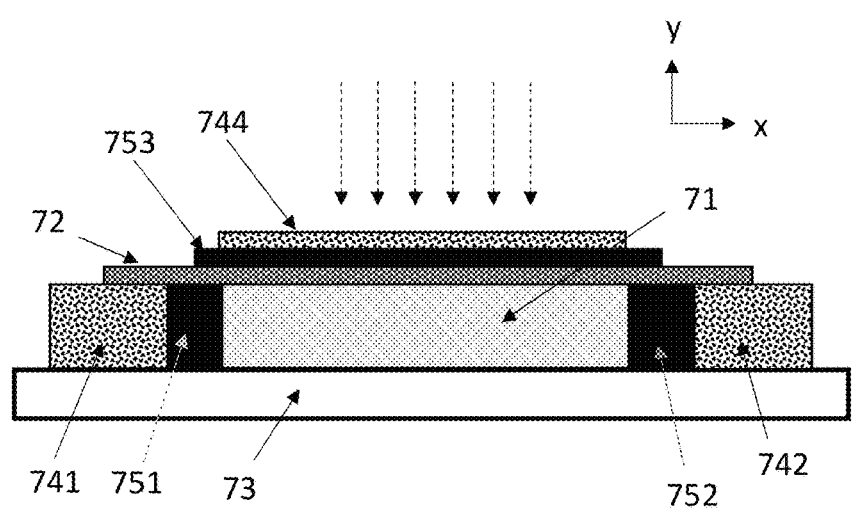
Figure 7C:
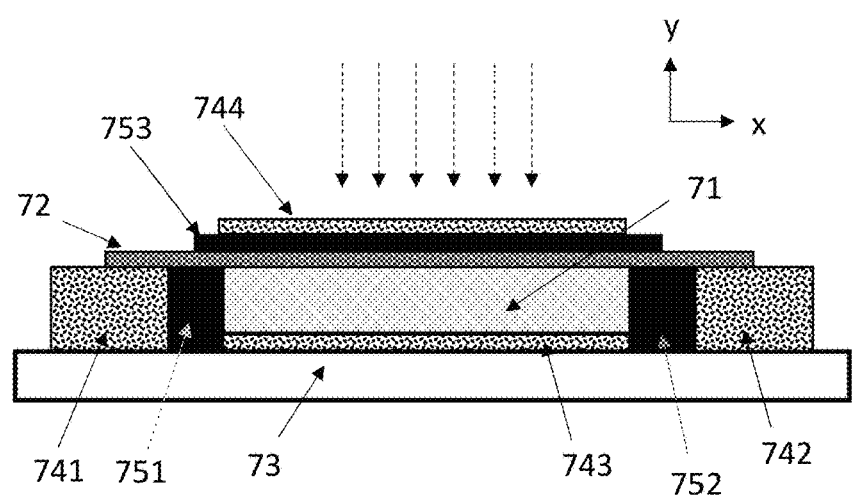

FIGS. 7a-7c illustrate photosensitive field-effect transistors according to a second device embodiment. The layers of the device have not been drawn to scale. In the devices illustrated in FIGS. 7a-7c, the graphene layer 72 and the semiconducting layer 71 have been deposited in the order illustrated in FIG. 1c, with the graphene layer 72 on top of semiconducting layer 71. Reference numbers 71, 72, 73, 741, 742 and 743 correspond to reference numbers 61, 62, 63, 641, 642 and 643 in FIGS. 6a-6c.

FIG. 7a illustrates a transistor where the layer of two-dimensional material 72 covers the semiconducting layer 71, and the semiconducting layer at least partly covers a bottom electrode 743. In other words, in this configuration the first gate electrode 743 is separated from the graphene layer 72 by the semiconducting layer 71. The first gate electrode 743 and the semiconducting layer 71 may be flanked on both sides by insulating layers 751 and 752 which separate them from the source and drain electrodes 741 and 742 and which provide a level top surface on which the transistor channel 72 can extend from the source electrode 741 to the gate electrode 742. In all devices illustrated in FIGS. 6a-6c and 7a-7c, additional protective layers may be deposited over the illustrated device elements.

FIG. 7b illustrates a transistor where the gate electrode 744 at least partly covers an insulating layer 753, the insulating layer 753 at least partly covers the layer of two-dimensional material 72, and the layer of two-dimensional material partly covers the semiconducting layer 71.

In other words, in this top-gate configuration insulating layers 751 and 752 separate the semiconducting layer 71 from the source and drain electrodes 741 and 742. A further insulating layer 753 has been deposited on the graphene layer 72 to separate the second gate electrode 744 from the graphene layer 72.

FIG. 7c illustrates a field-effect transistor where the layer of two-dimensional material 72 covers the semiconducting layer 71 and the semiconducting layer 71 at least partly covers a bottom electrode 743. Additionally, an insulating layer 753 at least partly covers the layer of two-dimensional material 72, and a gate electrode 72 at least partly covers the insulating layer 753.

Practical Example

To illustrate the claimed invention, a structure corresponding to FIG. 6a was manufactured by depositing a semiconducting layer comprising PbS quantum dots on a graphene channel using a spin-coating technique. The quantum dot layer was patterned via photolithography and lift-off. The ligand exchange was performed using 3-mercaptopropionic acid (MPA) ligands in the solid-state manner.

Figure 8A:
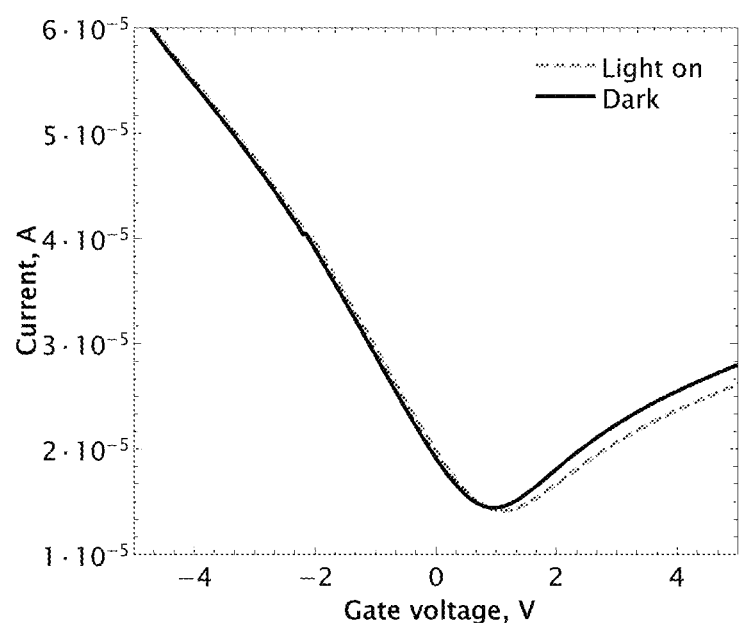
FIG. 8a shows a photoresponse measured from a photosensitive field-effect transistor where the semiconducting layer comprises only one semiconducting material.

In a first example, the semiconducting layer comprised only one assembly comprising PbS quantum dots with a bandgap of 0.7 eV and a work function of 4.7 eV. The transfer characteristics of this photosensitive field-effect transistor is illustrated in FIG. 8a.

Figure 8B:
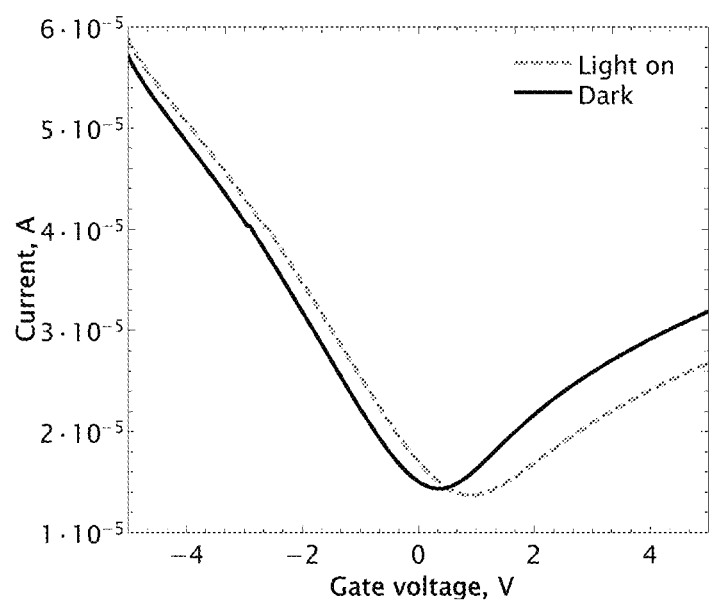
FIG. 8b shows a photoresponse measured from a photosensitive field-effect transistor where the semiconducting layer comprises a tandem stack of semiconducting materials.

In a second example, the semiconducting layer comprised two assemblies. The first assembly deposited on the graphene channel comprised PbS quantum dots with a bandgap of 0.7 eV and a work function of 4.7 eV. The second assembly, deposited on the first assembly, comprised PbS quantum dots with a bandgap of 1.3 eV and a work function of 4.2 eV. The transfer characteristics of this photosensitive field-effect transistor is illustrated in FIG. 8b.

Both of these exemplary photosensitive field-effect transistors had an area of 30 µm×30 µm and both were biased with a voltage of −0.1 eV. The gate voltage was swept from −5 V to +5 V in light and dark conditions. Photoresponses recorded for 520 nm wavelength illumination (1.1 W·m$^{-2}$) are illustrated in FIGS. 8a and 8b. It can be seen from FIGS. 8a and 8b that the tandem absorber, having in vertical order an increasing bandgap and decreasing work function, results in a greater shift of the graphene transfer curve upon light illumination. This indicates that there is a stronger photogating effect leading to larger photo generated currents in the transistor channel. One may thus expect a higher sensitivity of the phototransistor coupled with the tandem structure, where the semiconducting layer comprises assemblies stacked in order of decreasing work function.

The invention claimed is:

1. A photosensitive field-effect transistor configured to provide an electrical response when illuminated by electromagnetic radiation incident on the transistor, wherein the photosensitive field-effect transistor comprises:
    at least one electrically conducting source electrode and at least one electrically conducting drain electrode;
    a layer of two-dimensional material which forms a horizontal transistor channel configured to transport current between the at least one source electrode and the at least one drain electrode;
    at least one electrically conducting gate electrode which overlies or underlies the layer of two-dimensional material; and
    a horizontal semiconducting layer in contact with the transistor channel, which can be configured to donate charge carriers to the transistor channel when electromagnetic radiation is absorbed in the semiconducting layer, wherein the semiconducting layer comprises two or more assemblies of semiconducting materials,
    wherein the two-dimensional material in the transistor channel has a high work function, and the assemblies of semiconducting material are vertically stacked on the transistor channel in order of decreasing work function.

2. A photosensitive field-effect transistor configured to provide an electrical response when illuminated by electromagnetic radiation incident on the transistor, wherein the photosensitive field-effect transistor comprises:
    at least one electrically conducting source electrode and at least one electrically conducting drain electrode;
    a layer of two-dimensional material which forms a horizontal transistor channel configured to transport current between the at least one source electrode and the at least one drain electrode;
    at least one electrically conducting gate electrode which overlies or underlies the layer of two-dimensional material; and
    a horizontal semiconducting layer in contact with the transistor channel, which can be configured to donate charge carriers to the transistor channel when electromagnetic radiation is absorbed in the semiconducting layer, wherein the semiconducting layer comprises two or more assemblies of semiconducting materials,
    wherein the two-dimensional material in the transistor channel has a low work function, and the assemblies of semiconducting material are vertically stacked on the transistor channel in order of increasing work function.

3. The photosensitive field-effect transistor according to claim 1, wherein the assemblies of semiconducting material are vertically stacked on the transistor channel also in order of increasing bandgap.

4. The photosensitive field-effect transistor according to claim 1, wherein each of the assemblies of semiconducting material comprise semiconductor nanocrystals or colloidal quantum dots.

5. The photosensitive field-effect transistor according to claim 1, wherein the assembly of semiconducting material which is in contact with the transistor channel comprises a thin-film semiconducting layer, and the additional assemblies of semiconducting material comprise semiconductor nanocrystals or colloidal quantum dots.

6. The photosensitive field-effect transistor according to claim 1, wherein each of the assemblies of semiconducting material comprises a thin-film semiconducting layer.

7. The photosensitive field-effect transistor according to claim 1, wherein the semiconducting layer at least partly covers the layer of two-dimensional material, the layer of two-dimensional material covers a first insulating layer, and the first insulating layer covers a first gate electrode.

8. The photosensitive field-effect transistor according to claim 7, wherein a second gate electrode at least partly covers a second insulating layer, and the second insulating layer at least partly covers the semiconducting layer.

9. The photosensitive field-effect transistor according to claim 7, wherein a top electrode at least partly covers the semiconducting layer.

10. The photosensitive field-effect transistor according to claim 1, wherein the layer of two-dimensional material covers the semiconducting layer.

11. The photosensitive field-effect transistor according to claim 10, wherein the semiconducting layer at least partly covers a bottom electrode.

12. The photosensitive field-effect transistor according to claim 10, wherein an insulating layer at least partly covers the layer of two-dimensional material, and a gate electrode at least partly covers the insulating layer.

13. The photosensitive field-effect transistor according to claim 10, wherein the semiconducting layer at least partly covers a bottom electrode, and an insulating layer at least partly covers the layer of two-dimensional material, and a gate electrode at least partly covers the insulating layer.

* * * * *